(12) United States Patent
Yamauchi et al.

(10) Patent No.: US 10,277,235 B2
(45) Date of Patent: Apr. 30, 2019

(54) SYNTHESIZER

(71) Applicant: Mitsubishi Electric Corporation, Chiyoda-ku (JP)

(72) Inventors: Kazuhisa Yamauchi, Tokyo (JP); Nobuhiro Tokumori, Tokyo (JP); Kenji Miyasaka, Tokyo (JP); Takashi Fujiwara, Tokyo (JP); Masaki Kawamura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/552,125

(22) PCT Filed: Apr. 13, 2016

(86) PCT No.: PCT/JP2016/061902
§ 371 (c)(1),
(2) Date: Aug. 18, 2017

(87) PCT Pub. No.: WO2016/167283
PCT Pub. Date: Oct. 20, 2016

(65) Prior Publication Data
US 2018/0048323 A1 Feb. 15, 2018

(30) Foreign Application Priority Data

Apr. 15, 2015 (JP) .................... 2015-083451

(51) Int. Cl.
*H03L 7/00* (2006.01)
*H03L 7/06* (2006.01)
(Continued)

(52) U.S. Cl.
CPC ............ *H03L 7/23* (2013.01); *H03L 7/185* (2013.01); *H03L 7/1974* (2013.01)

(58) Field of Classification Search
CPC .......... H03L 7/23; H03L 7/185; H03L 7/1974
(Continued)

(56) References Cited

U.S. PATENT DOCUMENTS 4,839,603 A * 6/1989 Mower .................... H03L 7/23
327/105
5,856,766 A * 1/1999 Gillig ..................... H03L 1/026
327/105
(Continued)

FOREIGN PATENT DOCUMENTS

JP 64-055911 A 3/1989
JP 6-188733 A 7/1994
(Continued)

OTHER PUBLICATIONS

"Product Specification PE 97632", p. 12 Equation (2), Peregrin Semiconductor Corp., (17 pages).
(Continued)

*Primary Examiner* — Brandon S Cole
(74) *Attorney, Agent, or Firm* — Oblon, McClelland, Maier & Neustadt, L.L.P.

(57) ABSTRACT

A fine-adjustment synthesizer includes a fractional phase-locked loop having a reference integer frequency divider, a phase comparator, a loop filter, a frequency variable oscillator, a mixer, a baud-pass filter, and a feedback path programmable fractional frequency divider. A coarse-adjustment synthesizer includes an integer-type phase-locked loop having a reference integer frequency divider, a phase comparator, a loop filter, a frequency variable oscillator, a band-pass filter, and a feedback path programmable integer frequency divider. An output of a reference signal source is input in parallel to both the fine-adjustment synthesizer and the coarse-adjustment synthesizer. An output of the frequency variable oscillator in the fine-adjustment synthesizer and an output of the frequency variable oscillator in the (Continued)

coarse-adjustment synthesizer are guided to the mixer and an output signal of the fine-adjustment synthesizer is guided to an output end.

6 Claims, 5 Drawing Sheets

(51) Int. Cl.
*H03L 7/087* (2006.01)
*H03L 7/18* (2006.01)
*H03D 3/24* (2006.01)
*H03L 7/23* (2006.01)
*H03L 7/185* (2006.01)
*H03L 7/197* (2006.01)

(58) Field of Classification Search
USPC .............. 327/2–12, 105–123, 141, 144–163; 331/1 A, 15–17; 375/373–376
See application file for complete search history.

(56) References Cited

U.S. PATENT DOCUMENTS

| | | | |
|---|---|---|---|
| 5,872,487 A | 2/1999 | Adachi et al. | |
| 6,121,844 A | 9/2000 | Suzuki | |
| 6,366,620 B1* | 4/2002 | Jackson | H03C 3/0983 |
| | | | 332/127 |
| 6,396,353 B1 | 5/2002 | Krobel et al. | |
| 6,441,692 B1* | 8/2002 | Nakatani | H03L 7/18 |
| | | | 327/105 |
| 7,602,253 B2 | 10/2009 | Kim et al. | |
| 8,278,910 B2 | 10/2012 | Machida et al. | |
| 8,373,461 B2 | 2/2013 | Okabe | |
| 8,378,751 B2* | 2/2013 | Fagg | H03L 7/185 |
| | | | 331/10 |
| 9,112,517 B1* | 8/2015 | Lye | H03L 7/087 |
| 2003/0035503 A1 | 2/2003 | Sanduleanu | |
| 2011/0116586 A1* | 5/2011 | Chang | H03L 7/185 |
| | | | 375/376 |

FOREIGN PATENT DOCUMENTS

| | | |
|---|---|---|
| JP | 09-149002 A | 6/1997 |
| JP | 09-266453 A | 10/1997 |
| JP | 09-331255 A | 12/1997 |
| JP | 11-055113 A | 2/1999 |
| JP | 11-205137 A | 7/1999 |
| JP | 2001-044831 A | 2/2001 |
| JP | 2002-246899 A | 8/2002 |
| JP | 2005-026691 A | 1/2005 |
| JP | 2005-500742 A | 1/2005 |
| JP | 2005-295035 A | 10/2005 |
| JP | 2007-134832 A | 5/2007 |
| JP | 2008-148346 A | 6/2008 |
| JP | 2009-018973 A | 1/2009 |
| JP | 2011-010445 A | 1/2011 |
| JP | 2011-087187 A | 4/2011 |
| JP | 2011-244279 A | 12/2011 |
| JP | 2012-518336 A | 8/2012 |
| WO | 1999/005792 A1 | 2/1999 |
| WO | 03/017563 A2 | 2/2003 |
| WO | 2010/09361 A1 | 8/2010 |

OTHER PUBLICATIONS

International Search report dated Jul. 5, 2016 in PCT/JP2016/061902, filed Apr. 13, 2016.

* cited by examiner

SYNTHESIZER

FIELD

The present invention relates to a synthesizer which generates a signal with an arbitrary frequency using a phase-locked loop thereinafter denoted as "PLL").

BACKGROUND

In order to cope with diversification of applications of wireless communication, it is desired that synthesizers can generate an arbitrary frequency from a single local oscillator over a wide band. One method for generating an arbitrary frequency from a single local oscillator over a wide band is a fractional PLL (see, for example, Non Patent Literature 1 below).

It is known that in the fractional PLL, a fractional spurious component occurs in the vicinity of an oscillation frequency when resolution in frequency setting is made finer. Since fractional spurious components cannot be eliminated by a loop filter of the PLL, the resolution in the frequency setting is restricted. Therefore, various methods for reducing fractional spurious components have been proposed (for example, see Patent Literature 1 below).

In the synthesizer described in Patent Literature 1, a first loop for generating a high frequency signal and a second loop for generating a reference signal are included, and these first and second loops form a double feedback loop. The second loop adjusts the reference frequency of the first loop to a target frequency and the first loop uses the reference frequency finely adjusted by the second loop to generate the high frequency signal. That is, in Patent Literature 1, by controlling the reference signal of the first loop necessary for stabilizing the high frequency signal by the second loop, a spurious component occurring in the vicinity of a desired wave is suppressed.

CITATION LIST

Patent Literature

Patent Literature 1: Japanese Patent Application Laid-Open No. 2009-16973

Non Patent Literature

Non Patent Literature 1: "Product Specification PE 97631" p. 12, Equation (2), Peregrine Semiconductor Corp.

SUMMARY

Technical Problem

The synthesizer disclosed in Non Patent Literature 1 has an advantage of being capable of generating an arbitrary frequency from a single local oscillator over a wide band with a simple configuration. However, there is a problem that when resolution in frequency setting is made finer, a fractional spurious component which cannot be eliminated by a loop filter of a PLL occurs in the vicinity of an oscillation frequency, and accordingly, the resolution in the frequency setting is restricted.

In addition, the synthesizer of Patent Literature 1 has an advantage of being capable of suppressing a spurious component occurring in the vicinity of a desired wave without lowering frequency resolution. However, although one of the two synthesizers operates based on a reference signal source with good phase noise, another synthesizer uses a signal generated by the one synthesizer as a reference signal source, and voltage addition is performed to the phase noise of the two synthesizers in the course of processing, and thus there is a problem that the phase noise deteriorates.

The present invention has been made in view of the above, and an object of the present invention is to provide a synthesizer capable of suppressing occurrence of a fractional spurious component and suppressing deterioration of phase noise.

Solution to Problem

In order to solve the above-mentioned problems and achieve the object, the synthesizer according to the present invention includes a parallel-type double loop in which a fine-adjustment synthesizer and a coarse-adjustment synthesizer are connected in parallel. The fine-adjustment synthesizer uses an integer-type PLL for generating a signal with an arbitrary frequency. The coarse-adjustment synthesizer uses an integer-type PLL having a low degree of frequency generation freedom but having a low phase noise characteristics.

Advantageous Effects of Invention

According to the present invention, since the two synthesizers constituting the parallel-type double loop operate base don the reference signal source with low phase noise, the phase noise becomes small. Also, since the two synthesizers are synthesized by a mixer, power addition is performed reducing deterioration of phase noise. With these two features, it is possible to achieve both of two characteristics, i.e. the low phase noise characteristic and suppression of fractional spurious components, without lowering frequency resolution.

DESCRIPTION OF EMBODIMENTS

Hereinafter, a synthesizer according to an embodiment of the present invention will be described in detail with reference to the drawings. It should be noted that the present invention is not limited by the following embodiment.

Figure 1:
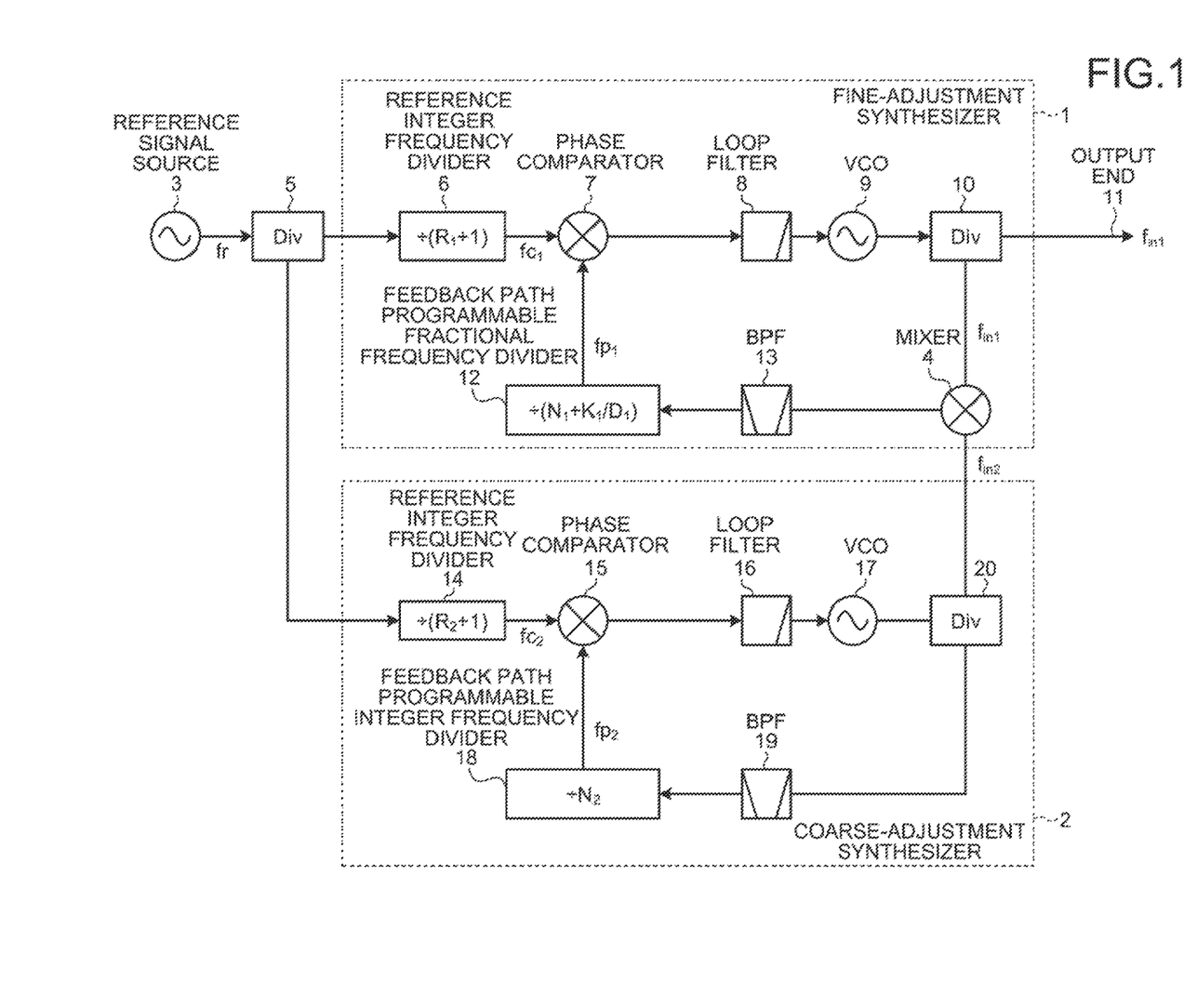
FIG. 1 is a block diagram illustrating a configuration of a synthesizer according to an embodiment of the present invention.

FIG. 1 is a block diagram illustrating a configuration of the synthesizer according to the embodiment of the present invention. As illustrated in FIG. 1, the synthesizer according to the present embodiment constitutes a parallel-type double loop in which a fine-adjustment synthesizer 1 using a fractional PLL and a coarse-adjustment synthesizer 2 using an integer-type PLL are connected in parallel.

The fine-adjustment synthesizer 1 includes: an integer frequency divider for reference (hereinafter referred to as a "reference integer frequency divider") 6; a phase comparator 7; a loop filter 8; a frequency variable voltage-controlled oscillator (denoted as "VCO" in FIG. 1, hereinafter referred to as a "frequency variable oscillator") 9; a divider (denoted as "Div" in FIG. 1) 10; a mixer 4; a band-pass filter (denoted as "BPF" in FIG. 1) 13; and a programmable fractional-type frequency divider arranged in a feedback path (hereinafter referred to as a "feedback path programmable fractional frequency divider") 12. In the fine-adjustment synthesizer 1, the reference integer frequency divider 6, the phase comparator 7, the loop filter 8, the frequency variable oscillator 9, the mixer 4, the band-pass filter 13 and the feedback path programmable fractional frequency divider 12 constitute a fractional phase-locked loop.

The coarse-adjustment synthesizer 2 includes a reference integer frequency divider 14, a phase comparator 15, a loop filter 16, a frequency variable oscillator 17, a divider 20, a band-pass filter 19, and a programmable integer-type frequency divider arranged in a feedback path (hereinafter referred to as a "feedback path programmable integer frequency divider") 18. In the coarse-adjustment synthesizer 2, the reference integer frequency divider 14, the phase comparator 15, the loop filter 16, the frequency variable oscillator 17, the band-pass filter 19, and the feedback path programmable integer frequency divider 18 constitute an integer-type phase-locked loop.

An output of a reference signal source 3 is input in parallel to both the coarse-adjustment synthesizer 2 and the fine-adjustment synthesizer 1 via the divider 5. In the fine-adjustment synthesizer 1, an output of the frequency variable oscillator 9 via the divider 10 and an output of the frequency variable oscillator 17 via the divider 20 are guided to the mixer 4 constituting the fractional phase-locked loop, and an output signal of the fine-adjustment synthesizer 1 is guided to an output end 11. It is configured such that a divider of the feedback path programmable integer frequency divider 18 and a divisor of the feedback path programmable fractional frequency divider 12 can be changed based on a control signal that comes from the outside of the synthesizer.

Next, an operation of the synthesizer according to the present embodiment will be described with reference to FIG. 1. First, a reference signal (frequency: fr) generated by the reference signal source 3 is divided into the fine-adjustment synthesizer 1 and the coarse-adjustment synthesizer 2 by the divider 5.

The reference signal divided and provided to the coarse-adjustment synthesizer 2 is subjected to integer frequency division in the reference integer frequency divider 14 and then guided to the phase comparator 15. In the phase comparator 15, a phase of an output signal (frequency: $fc_2$) of the reference integer frequency divider 14 is compared with a phase of an output signal (frequency: $fp_2$) that comes from the feedback path programmable integer frequency divider 18. An output signal in accordance with a difference between the above described phases is band-limited by the loop filter 16 and then guided to the frequency variable oscillator 17. An output signal (frequency: $f_{in2}$) of the frequency variable oscillator 17 is divided into the mixer 4 and the band-pass filter 19 by the divider 20. The signal guided to the band-pass filter 19 is band-limited and then guided to the feedback path programmable integer frequency divider 18. A signal with a frequency of $fp_2$ is output from the feedback path programmable integer frequency divider 18, and the above-described operation is repeated.

On the other hand, the reference signal divided and provided to the fine-adjustment synthesizer 1 is subjected to integer frequency division in the reference integer frequency divider 6 and then guided to the phase comparator 7. In the phase comparator 7, a phase of an output signal (frequency: $fc_1$) of the reference integer frequency divider 6 is compared with a phase of an output signal (frequency: $fp_1$) that comes from the feedback path programmable fractional frequency divider 12. An output signal in accordance with a difference between the above described phases is band-limited by the loop filter 8 and then guided to the frequency variable oscillator 9. An output of the frequency variable oscillator 9 is divided into the mixer 4 and the output end 11 of the synthesizer by the divider 10. A signal (frequency: $f_{in1}$) guided to the mixer 4 is mixed with the signal (frequency: $f_{in2}$) that comes from the coarse-adjustment synthesizer 2, and the mixed signal is band-limited by the band-pass filter 13 and then guided to the feedback path programmable fractional frequency divider 12. A signal with a frequency of $fp_1$ is output from the feedback path programmable fractional frequency divider 12, and the above-described operation is repeated.

In the present embodiment, a synthesizer is configured to include a parallel-type double loop in which the fine-adjustment synthesizer 1 and the coarse-adjustment synthesizer 2 are connected in parallel. The fine-adjustment synthesizer 1 uses a fractional PLL capable of generating a signal with an arbitrary frequency and the coarse-adjustment synthesizer 2 uses an integer-type PLL having a low degree of frequency generation freedom but having a low phase noise characteristic. Here, the fine-adjustment synthesizer 1 and the coarse-adjustment synthesizer 2 both operate with the reference signal source 3 having a low phase noise characteristic. Therefore, according to the synthesizer of the present embodiment, it is possible to achieve both of the two characteristics, i.e. the low phase noise characteristic and suppression of fractional spurious components, without lowering frequency resolution.

In order to confirm the effectiveness of the configuration according to the present embodiment, a spectrum of a 2-GHz band synthesizer, which is capable of setting a band of 40.96 MHz in increments of 10 kHz using a phase comparison frequency of 40.96 MHz, was measured in each of the present embodiment and a conventional configuration.

Figure 2:
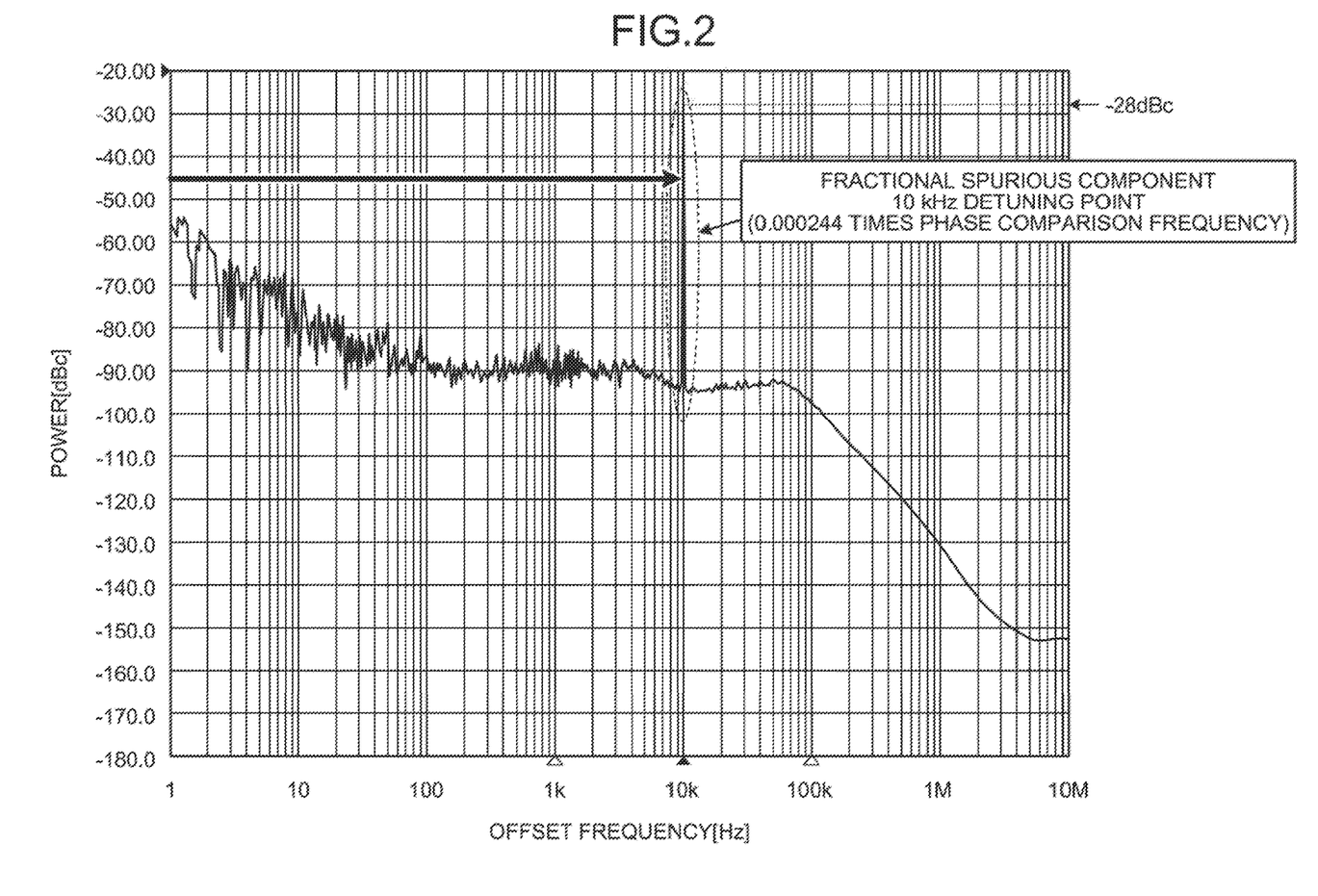
FIG. 2 is a graph illustrating a result of spectrum measurement in a configuration disclosed in Non Patent Literature 1.
Figure 3:
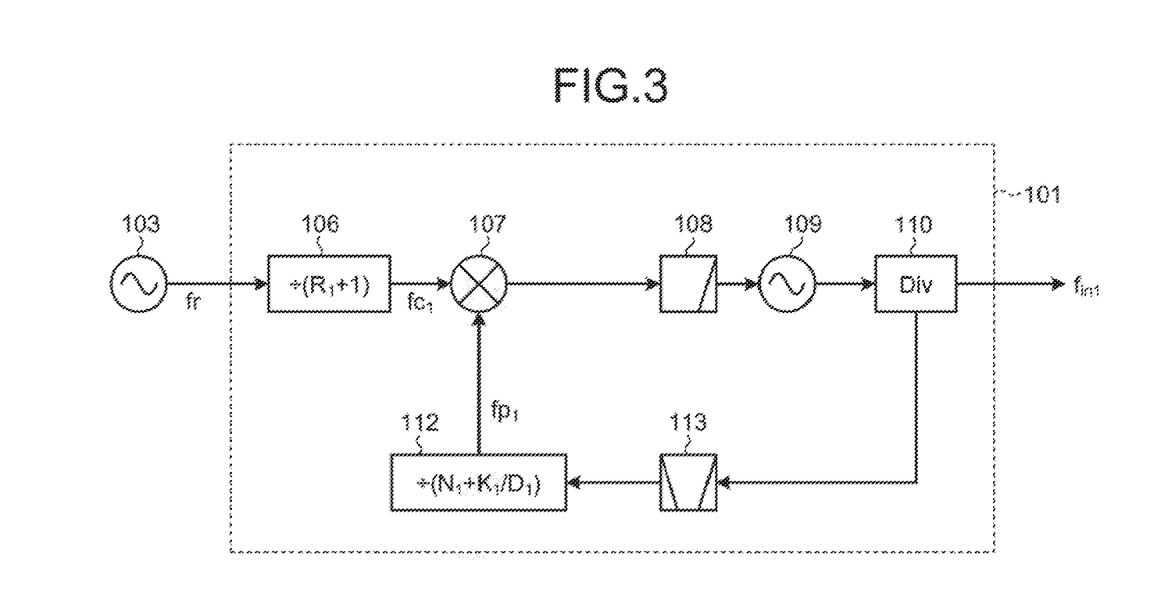
FIG. 3 is a block diagram illustrating a configuration of a synthesizer used in the measurement illustrated in FIG. 2.

FIG. 2 is a diagram illustrating a result of spectrum measurement in the configuration disclosed in Non Patent Literature 1 described above. FIG. 3 is a block diagram illustrating a configuration of a synthesizer 101 used in the measurement illustrated in FIG. 2. The configuration in FIG. 3 corresponds to a configuration excluding the mixer 4 in the fine-adjustment synthesizer 1 of FIG. 1. In the configuration of FIG. 3, an output of a divider 110 is input to a band-pass filter 113, and a reference signal (frequency: fr) generated by the reference signal source 103 is input to the reference integer frequency divider 106. A phase comparator 107, a loop filter 108, a frequency variable oscillator 109, the divider 110, the band-pass filter 113, and a feedback path programmable fractional frequency divider 112 constitute a loop.

Here, Non Patent Literature 1 indicates that a frequency $F_{spur}$ of a fractional spurious component is expressed by the following formula.

[Formula 1]

$$F_{spur} = \frac{K_1}{D_1} f_{e1}, \text{ provided that } 1 \leq K_1 \leq \frac{1}{2} D_1 \quad (1)$$

$$F_{spur} = \left(1 - \frac{K_1}{D_1}\right) f_{e1}, \text{ provided that } 1 + \frac{1}{2} D_1 \leq K_1 < D_1$$

In the formula (1), $K_1$ denotes a fractional design value of the feedback path programmable fractional frequency divider 112, $D_1$ denotes a maximum frequency division value of the frequency divider, and $f_{c1}$ denotes a phase comparison frequency. The fractional spurious component occurs at a frequency close to an oscillation frequency $f_{in1}$ when a minimum set value of $K_1$ is $K_{1\_min}$. Therefore, a detuning frequency $F_{spur}$ of the fractional spurious component with respect to the oscillation frequency $f_{in1}$ is $(K_{1\_min}/D_1) \cdot f_{c1}$. According to Non Patent Literature 1, this value is 10 kHz which is a frequency step.

Referring to FIG. 2, a fractional spurious component of −28 [dBc] occurs at a point 10 kHz away from the phase comparison frequency $f_{c1}$ (=40.96 MHz) (0.000244 times the phase comparison frequency $f_{c1}$, hereinafter referred to as a "10 kHz detuning point"), and thus it is understood that a measurement result equivalent to a theoretical value is illustrated.

Figure 4:
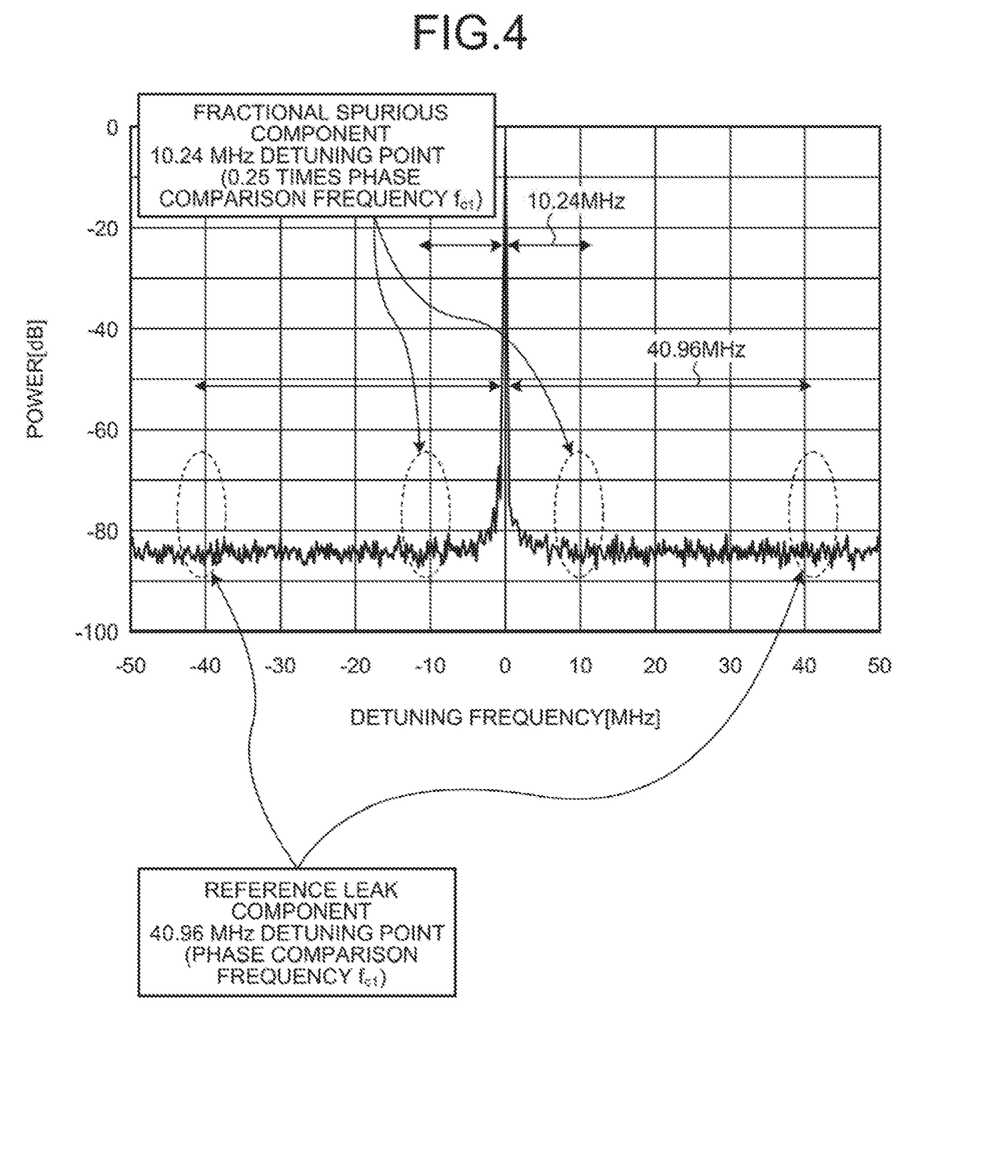
FIG. 4 is a diagram illustrating a result of spectrum measurement in the synthesizer according to the embodiment of the present invention.

FIG. 4 is a diagram illustrating a result of spectrum measurement in the synthesizer according to the present embodiment. In FIG. 4, it is assumed that $K_1$ is set to satisfy 0.25≤$K_1$≤0.75, and the phase comparison frequency $f_{c2}$ in the coarse-adjustment synthesizer 2 is set to ½ of the phase comparison frequency $f_{c1}$ in the fine-adjustment synthesizer 1 ($f_{c1}$=40.96 [MHz], $f_{c2}$=20.48 [MHz]).

At that time, a minimum detuning frequency of the fractional spurious component with respect to the oscillation frequency $f_{in1}$ is 0.25 $f_{c1}$, that is, 10.24 MHz. When it is desired to set the frequency to satisfy $K_1$≤0.25 or $K_1$≥0.75, it is possible to set the fine-adjustment synthesizer 1 to satisfy 0.25≤$K_1$≤0.75 by changing the frequency of the coarse-adjustment synthesizer 2.

As described above, in the synthesizer of the present embodiment, the frequency $f_{spur}$ of occurrence of the fractional spurious component can be kept away, from the 10 kHz detuning point to the 10.24 MHz detuning point, by adopting the parallel-type double loop configuration, and therefore it is possible to sufficiently suppress the fractional spurious component by the loop filter 8. Also in the measurement result in FIG. 4, the fractional spurious component occurring at the 10.24 MHz detuning point and the 40.96 MHz detuning point of the oscillation frequency $f_{in1}$ (=40.96 [MHz]) are sufficiently suppressed as indicated by a broken line part in the figure, which makes it evident that the synthesizer according to the present embodiment is effective for suppressing the fractional spurious component.

In the present embodiment, the case where the phase comparison frequency $f_{c2}$ of the coarse-adjustment synthesizer 2 is set to ½ of the phase comparison frequency $f_{c1}$ of the fine-adjustment synthesizer 1 has been described as an example, but it may be set to a power of ½. If it is set to a power of ½, it becomes possible to continuously set a frequency capable of oscillation.

In the configuration of the present embodiment, when a frequency is varied by changing only the fractional frequency division value ($K_1/D_1$) of the feedback path programmable fractional frequency divider 12 (that is, when $N_1$ is fixed and only a ($K_1/D_1$) value is changed); it is possible to set a minimum detuning frequency, in which the fractional spurious component occurs, to be greater than or equal to ¼ of the phase comparison frequency $f_{c1}$ by setting a frequency variable bandwidth to be less than or equal to ½ of the phase comparison frequency $f_{c1}$, centered on a frequency with the fractional frequency division value ($K_1/D_1$) of 0.5. By performing the setting as described above, suppression of spurious components by the loop filter 8 can be facilitated.

If inputting, of a signal with a sum frequency ($f_{in1}+f_{in2}$) and a signal with a difference frequency |$f_{in1}+f_{in2}$| generated when frequency conversion is performed by the mixer 4 in the fine-adjustment synthesizer 1, the signal with the difference frequency |$f_{in1}+f_{in2}$| to the feedback path programmable fractional frequency divider 12, a divisor of the feedback path programmable fractional frequency divider 12 can be set to be small, and a deterioration amount of phase noise in the fine-adjustment synthesizer 1 can be reduced. This method makes it possible to reduce the phase noise in the entire synthesizer.

In addition, when the fractional PLL and the integer-type PLL are manufactured by applying the same semiconductor process technology, the phase noise in the fractional PLL is generally worse than that in the integer-type PLL. Therefore, it is preferable as an embodiment that the divisor of the feedback path programmable fractional frequency divider 12 in the fine-adjustment synthesizer 1 be smaller than the divisor of the feedback path programmable integer frequency divider 18 in the coarse-adjustment synthesizer 2. With such an embodiment, it is possible to reduce the deterioration amount of the phase noise by the fine-adjustment synthesizer 1, and it is possible to improve the phase noise in the entire synthesizer.

In addition, by setting the phase comparison frequency $f_{c2}$ in the coarse-adjustment synthesizer 2 to ½ of the phase comparison frequency $f_{c1}$ in the fine-adjustment synthesizer 1, and adjusting a divisor of the reference integer frequency divider 14 of the coarse-adjustment synthesizer 2 to 2 ($R_2+1$=2, i.e. $R_2$=1), it is possible to delete the reference integer frequency divider 6 for performing frequency division of a signal that comes from an input terminal of the fine-adjustment synthesizer 1.

Furthermore, by constituting at least one of the coarse-adjustment synthesizer 2 and the fine-adjustment synthesizer 1 by a plurality of phase-locked loops including the mixer 4, power addition is performed for the phase noise between the synthesizers, so that phase noise can be further reduced.

Furthermore, by using an oscillator with a sampling phase detector (SPD) which has no frequency changing function but with which good phase noise can be obtained, it is possible to further reduce the phase noise.

Figure 5:
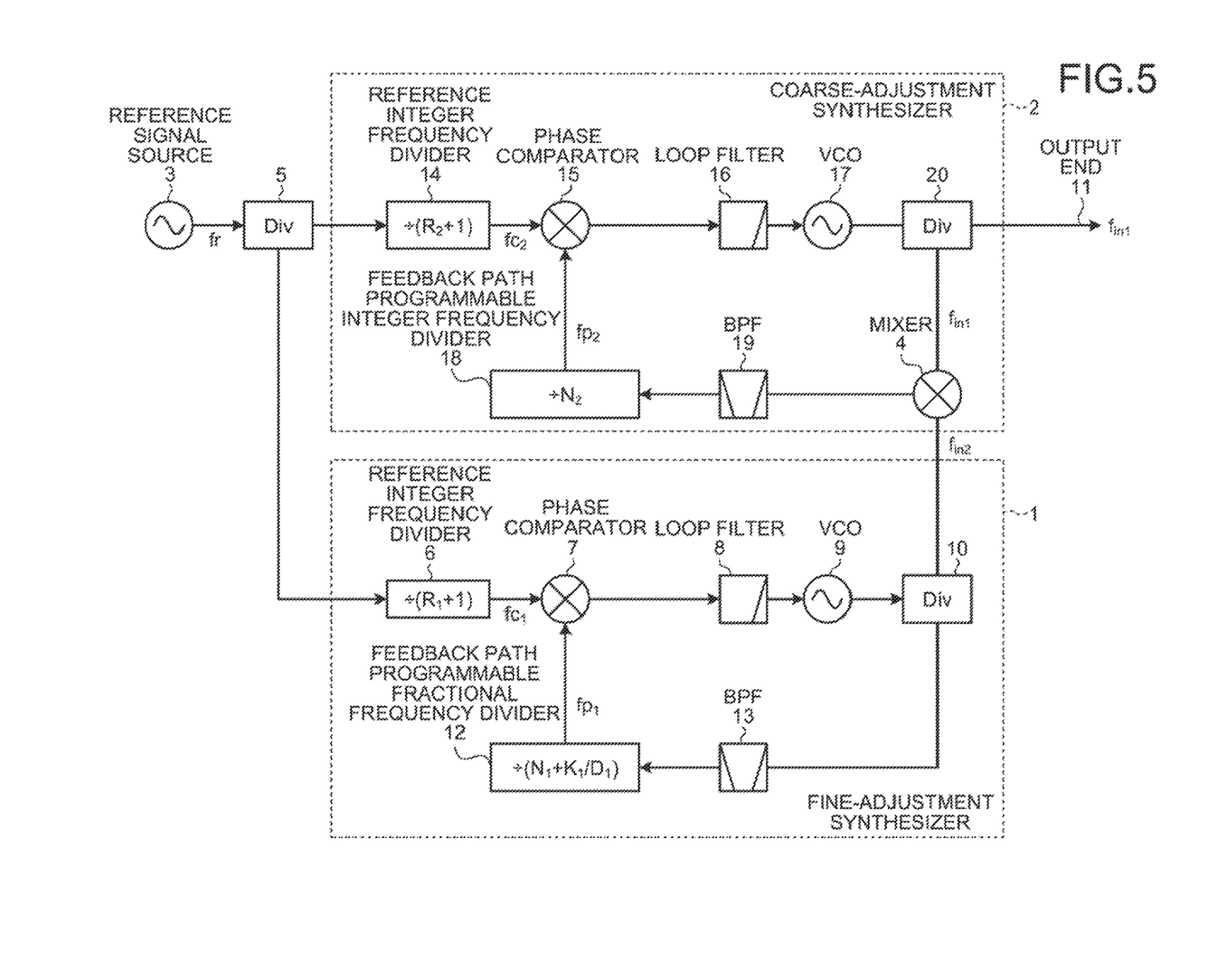
FIG. 5 is a block diagram illustrating a configuration of a synthesizer different from that of FIG. 1 according to the embodiment of the present invention.

The mixer 4 constituting the fine-adjustment synthesizer 1 in FIG. 1 may be removed, the coarse-adjustment synthesizer 2 and the fine-adjustment synthesizer 1 may be switched around, the coarse-adjustment synthesizer 2 may be provided with the mixer 4, and an output signal of the coarse-adjustment synthesizer 2 may be guided to the output end 11, as illustrated in FIG. 5. That is, the following configuration may be employed. The coarse-adjustment synthesizer 2 includes an integer-type phase-locked loop having the reference integer frequency divider 14, the phase comparator 15, the loop filter 16, the frequency variable oscillator 17, the mixer 4, the band-pass filter 19, and the feedback path programmable integer frequency divider 18. The fine-adjustment synthesizer 1 includes a fractional phase-locked loop having the reference integer frequency divider 6, the phase comparator 7, the loop filter 8, the frequency variable oscillator 9, the band-pass filter 13, and the feedback path programmable fractional frequency divider 12. An output of the reference signal source 3 is input in parallel to both the coarse-adjustment synthesizer 2 and the fine-adjustment synthesizer 1 via the divider 5, an output of the frequency variable oscillator 17 via the divider 20 and an output of the frequency variable oscillator 9 via the divider 10 are guided to the mixer 4 constituting the integer-type phase-locked loop, and the output signal of the coarse-adjustment synthesizer 2 is guided to the output end 11. Even with such a configuration, the same characteristics as those in the synthesizer illustrated in FIG. 1 can be achieved, so that the degree of freedom of the configuration of the synthesizer including the coarse-adjustment synthesizer 2 and the fine-adjustment synthesizer 1 can be enhanced.

The configuration described in the embodiment above indicates one example of the content of the present invention and can be combined with other known technology, and a part thereof can be omitted or modified without departing from the gist of the present invention.

REFERENCE SIGNS LIST 1 fine-adjustment synthesizer, 2 coarse-adjustment synthesizer, 3, 103 reference signal source, 4 mixer, 5, 10, 20, 110 divider (Div), 6, 14, 106 reference integer frequency divider, 7, 15, 107 phase comparator, 8, 16, 108 loop filter, 9, 17, 109 frequency variable oscillator (VCO), 11 output end, 12, 112 feedback path programmable fractional frequency divider, 13, 19, 113 band-pass filter (BPF), 18 feedback path programmable integer frequency divider.

The invention claimed is:

1. A synthesizer comprising a coarse-adjustment synthesizer and a fine-adjustment synthesizer, wherein
the coarse-adjustment synthesizer comprises an integer-type phase-locked loop having a reference integer frequency divider, a phase comparator, a loop filter, a frequency variable oscillator, a band-pass filter, and a feedback path programmable integer frequency divider, wherein an output signal of the frequency variable oscillator is guided to the band-pass filter and then guided to the feedback path programmable integer frequency divider,
the fine-adjustment synthesizer comprises a fractional phase-locked loop having a reference integer frequency divider, a phase comparator, a loop filter, a frequency variable oscillator, a mixer, a band-pass filter, and a feedback path programmable fractional frequency divider, wherein an output of the frequency variable oscillator is input to the mixer and mixed with a signal that is output from the coarse-adjustment synthesizer, and wherein the mixed signal is band-limited by the band-pass filter and then guided to the feedback path programmable fractional frequency divider,
an output of a reference signal source is input in parallel to both the coarse-adjustment synthesizer and the fine-adjustment synthesizer,
an output signal of the frequency variable oscillator in the fine-adjustment synthesizer and an output signal of the frequency variable oscillator in the coarse-adjustment synthesizer are guided to the mixer in the fractional phase-locked loop,
an output signal of the fine-adjustment synthesizer is output to an output end, and
a phase comparison frequency of the coarse-adjustment synthesizer is a power of ½ of a phase comparison frequency of the fine-adjustment synthesizer, thereby providing for a continuous setting of a frequency capable of oscillation.

2. The synthesizer according to claim 1, wherein the feedback path programmable fractional frequency divider is capable of setting a divisor with an integer frequency division value and a fractional frequency division value, and
a frequency variable bandwidth is set to be less than or equal to ½ of a phase comparison frequency, centered on a frequency with the fractional frequency division value of 0.5.

3. The synthesizer according to claim 1, wherein of a signal with a sum frequency and a signal with a difference frequency generated when frequency conversion is performed by the mixer, the signal with the difference frequency is input to the feedback path programmable fractional frequency divider.

4. The synthesizer according to claim 1, wherein a divisor of the feedback path programmable fractional frequency divider in the fine-adjustment synthesizer is smaller than a divisor of the feedback path programmable integer frequency divider in the coarse-adjustment synthesizer.

5. The synthesizer according to claim 1, wherein the reference integer frequency divider in the fine-adjustment synthesizer is deleted by setting the phase comparison frequency of the coarse-adjustment synthesizer to ½ of the phase comparison frequency of the fine-adjustment synthesizer and setting a divisor of the reference integer frequency divider in the coarse-adjustment synthesizer to 2.

6. The synthesizer according to claim 1, wherein at least one of the coarse-adjustment synthesizer and the fine-adjustment synthesizer comprises a plurality of phase-locked loops.

* * * * *